(12) United States Patent
Lee et al.

(10) Patent No.: US 7,435,606 B2
(45) Date of Patent: Oct. 14, 2008

(54) LIGHT EMITTING DEVICES AND METHOD FOR FABRICATING THE SAME

(75) Inventors: Hyunjae Lee, Yongin-si (KR); Junseok Ha, Seoul (KR)

(73) Assignee: LG Electronics Inc., Seoul (KR)

( * ) Notice: Subject to any disclaimer, the term of this patent is extended or adjusted under 35 U.S.C. 154(b) by 131 days.

(21) Appl. No.: 11/480,527

(22) Filed: Jul. 5, 2006

(65) Prior Publication Data

US 2007/0020789 A1    Jan. 25, 2007

(30) Foreign Application Priority Data

Jul. 5, 2005    (KR) .................. 10-2005-0060091

(51) Int. Cl.
*H01L 21/00* (2006.01)

(52) U.S. Cl. ............... 438/26; 438/113; 438/460

(58) Field of Classification Search .............. 438/22, 438/25, 26, 28, 113, 460, 464; 257/13, 81, 257/94, 95, 98, 99, 100
See application file for complete search history.

(56) References Cited

U.S. PATENT DOCUMENTS

| 2004/0076016 A1* | 4/2004 | Sato et al. ............ 362/555 |
| 2004/0245535 A1* | 12/2004 | D'Evelyn et al. ......... 257/94 |

* cited by examiner

*Primary Examiner*—Kevin M Picardat
(74) *Attorney, Agent, or Firm*—McKenna Long & Aldridge LLP

(57) ABSTRACT

Light emitting devices and a method for fabricating the same have an advantage in that an etching film formed between a plurality of light emitting structures is removed to separate respective lateral surfaces of the light emitting structures from one another, and a substrate is removed to separate lower portions of the devices from each other, thereby further facilitating division of the devices. There are further advantages in that the devices are divided without carrying out a scribing process so that the occurrence of defects such as cracking or bending can be reduced, and spacing between the devices for the scribing process need not be maintained, thereby increasing the degree of integration of devices.

18 Claims, 13 Drawing Sheets

LIGHT EMITTING DEVICES AND METHOD FOR FABRICATING THE SAME

This application claims priority to Korean Application No. 10-2005-0060091 filed on Jul. 5, 2005, which is incorporated by reference, as if fully set forth herein.

BACKGROUND

The present invention relates to light emitting devices and a method for fabricating the same.

In general, a light emitting device is fabricated by growing gallium nitride (GaN) crystals into a thin film. The best choice of growing the GaN crystals is a GaN substrate.

However, the GaN substrate is very expensive due to difficulty in growing GaN crystals, and the like.

Therefore, most of GaN-based light emitting devices are grown on heterogeneous substrates. The heterogeneous substrates include sapphire (A1203), silicone carbide (SiC), gallium arsenide (GaAs) and the like. Recently, a sapphire substrate among the heterogeneous substrates has been widely used.

FIGS. 1a to 1e are sectional views illustrating a conventional method for fabricating GaN-based light emitting devices. As shown in FIG. 1a, a plurality of light emitting structures (10) are formed on a sapphire substrate (20), each structure being spaced apart from one another.

Here, each of the plurality of light emitting structures (10) includes an active layer for generating light.

In addition, a P-electrode is deposited on each of the plurality of light emitting structures such that the P-electrode is in ohmic contact therewith, thereby stably supplying an external current to the light emitting structure.

Thereafter, a metallic film (30) is formed to wrap the plurality of light emitting structures (10) by means of plating or the like (FIG. 1b).

At this time, since the metallic film (30) holds the light emitting structures (10), the sapphire substrate (20) can be easily removed in a subsequent process.

Then, the sapphire substrate (20) is separated from each bottom of the light emitting structures (10) (FIG. 1c).

The sapphire substrate (20) may be removed using a laser lift off process.

Here, the laser lift off process is a process of separating and removing the sapphire substrate from the plurality of light emitting structures (10) wrapped by the metallic film (30), by irradiating a laser beam from below the sapphire substrate (20).

At this time, energy generated during the metallic film forming process and the laser lift off process is transferred directly to the metallic film, resulting in generation of stress in the metallic film Thus, defects such as cracking or bending of the metallic film occur. These defects lead to defective devices, thereby lowering a production yield of devices.

As shown in FIG. 1d, after the sapphire substrate is separated, a scribing process is performed to form a cutting groove (40) on the metallic film between adjacent light emitting structures (10) each structure spaced apart from each other.

At this time, the rigidity of metal itself may cause a crack (41) under the cutting groove (40). Further, the crack (41) may propagate to the light emitting structures, resulting in degradation of the quality of light emitting devices.

Finally, as shown in FIG. 1e, an expanding and breaking process is carried out, wherein a physical force is exerted on the adjacent light emitting structures wrapped by the metallic film (30) so as to individually divide the light emitting structures.

In the conventional fabrication process, the groove is formed on the metallic film to divide the light emitting structures and then used to perform the breaking process. However, since a lower portion of the metallic film may not be cut occasionally, there is a problem in that all the light emitting structures cannot be completely divided.

Particularly, if the metallic film is formed of a material with high ductility such as copper, the metallic film is easily stretched, causing difficulty in dividing the light emitting structures.

In addition, as described above, there is a high possibility that the crack (41) of the metallic film generated during the scribing process may propagate to the light emitting structures when the light emitting devices are divided.

Of course, there is a method for maximally reducing the propagation of the crack to the light emitting structures by increasing spacing between the light emitting structures. In this case, however, the number of devices to be integrated on a single wafer is decreased, resulting in inevitable reduction of a yield. This method is not a proper solution since there is a problem in that the existing scribing process should be improved.

SUMMARY

The present invention is conceived to solve the aforementioned problems. An object of the present invention is to provide light emitting devices and a method for fabricating the same, wherein an etching film is removed to separate respective lateral surfaces of light emitting structures from one another, and a substrate is removed to separate lower portions of the devices from each other, further facilitating division of the devices.

Another object of the present invention is to provide light emitting devices and a method for fabricating the same, wherein the devices are divided without carrying out a scribing process so that the occurrence of defects such as cracking or bending can be reduced, and spacing between the devices for the scribing process need not be maintained, thereby increasing the degree of integration of devices.

According to a first aspect of the present invention for achieving the objects, there is provided a method for fabricating light emitting devices, comprising: forming a plurality of light emitting structures on a heterogeneous substrate such that each structure is spaced apart from one another; forming an etching film out of a selectively etchable material between adjacent light emitting structures each spaced apart; forming a metallic film wrapping the plurality of light emitting structures and the etching film; separating the heterogeneous substrate from the plurality light emitting structures and the etching film wrapped by the metallic film; removing the etching film; and individually dividing the plurality of light emitting structures wrapped by the metallic film.

According to a second aspect of the present invention for achieving the objects, there is provided a method for fabricating light emitting devices, comprising: forming a plurality of light emitting structures on a heterogeneous substrate such that each structure is spaced apart from one another; forming an etching film, which has a height larger than that of each light emitting structure and is made of a selectively etchable material, between adjacent light emitting structures each spaced apart; forming a metallic film wrapping the plurality of light emitting structures and lateral surfaces of the etching film while exposing the top of the etching film; removing the etching film; and separating the heterogeneous substrate from the plurality light emitting structures wrapped by the metallic film.

According to a third aspect of the present invention for achieving the objects, there is provided a method for fabricating light emitting devices, comprising: forming a plurality of light emitting structures on a heterogeneous substrate such that the each structure is spaced apart from one another; forming an etching film, which is taller than each light emitting structure and is made of a selectively etchable material, between adjacent light emitting structures spaced apart from each other, the etching film; forming a metallic film wrapping the etching film and the plurality of light emitting structures; removing an upper portion of the metallic film to expose the top of the etching film; removing the etching film; and separating the heterogeneous substrate from the plurality light emitting structures wrapped by the metallic film.

According to a fourth aspect of the present invention for achieving the objects, there is provided a method for fabricating light emitting devices, comprising: forming a plurality of GaN-based light emitting structures on a heterogeneous substrate such that each structure is spaced apart from one another; forming an electrode on each of the plurality of GaN-based light emitting structures; forming an insulation film wrapping lateral surfaces of the plurality of GaN-based light emitting structures and lateral surfaces of the electrodes while isolating the plurality of GaN-based light emitting structures from one another; forming a seed layer wrapping the top of the electrode and an outer surface of the insulation film; forming an etching film out of a selectively etchable material on the seed layer between the spaced-apart GaN-based light emitting structures; forming a metallic film wrapping the top of the seed layer and the etching film; separating the heterogeneous substrate from the plurality of GaN-based light emitting structures; removing the etching film; and individually dividing the plurality of GaN-based light emitting structures wrapped by the metallic film.

According to a fifth aspect of the present invention for achieving the objects, there is provided a light emitting device, comprising: a light emitting structure including a first semiconductor layer with a first polarity, an active layer and a second semiconductor layer with a second polarity, which are sequentially stacked; a highly reflective film with an insulating property formed on lateral surfaces of the light emitting structure; a first electrode formed on the second semiconductor layer with the second polarity; and a second electrode formed under the first semiconductor layer with the first polarity.

DETAILED DESCRIPTION

Figure 1A:
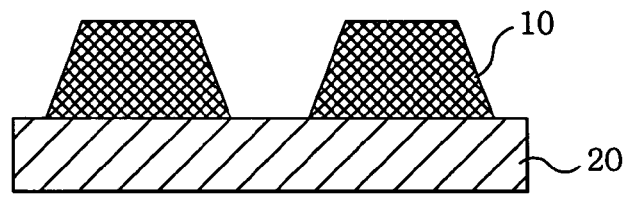
FIGS. 1a to 1e are sectional views illustrating a conventional method for fabricating GaN-based light emitting devices.
Figure 1B:
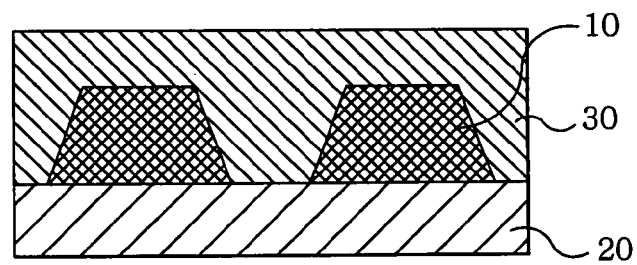
Figure 1C:
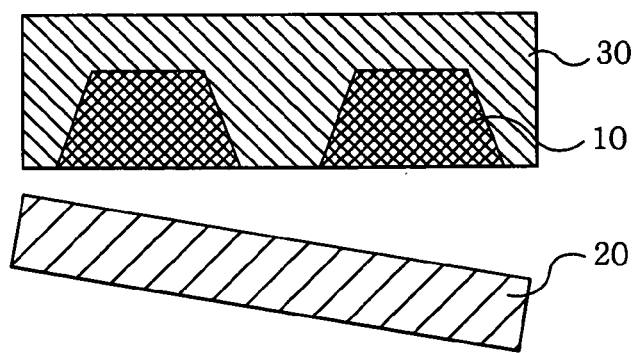
Figure 1D:
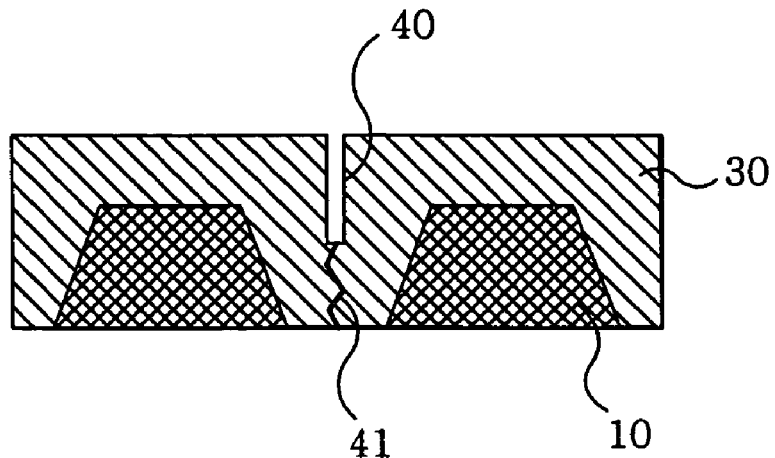
Figure 1E:
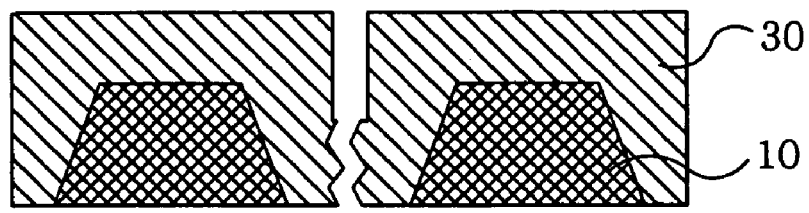
Figure 2A:
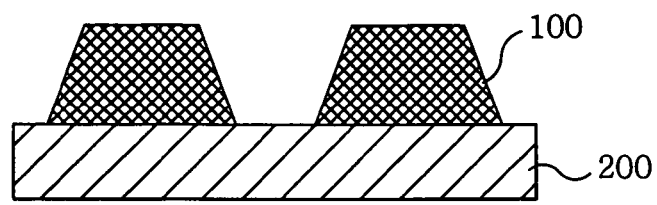
FIGS. 2a to 2e are sectional views illustrating a method for fabricating light emitting devices according to the present invention.

Referring to FIGS. 2a to 2e, a plurality of light emitting structures (100) are formed on a heterogeneous substrate (200) such that they are spaced apart from one another (FIG. 2a).

Figure 7:
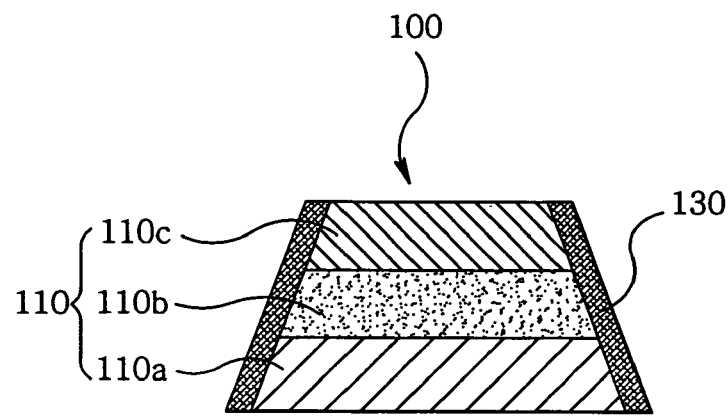
FIG. 7 is a schematic sectional view of a light emitting structure according to the present invention.

Here, each of the plurality of light emitting structures (100) includes an n-semiconductor layer (110a), an active layer (10b) and a p-semiconductor layer (110c), which are sequentially stacked as shown in FIG. 7. An insulation film (130) is formed on lateral surfaces of the n-semiconductor layer (110a), the active layer (110b) and the p-semiconductor (110c).

Here, the insulation film (130) is preferably a highly reflective film.

In addition, it is preferred that a p-electrode be deposited on each of the plurality of light emitting structures (100) such that the p-electrode is in ohmic contact therewith.

Furthermore, the heterogeneous substrate is preferably a sapphire substrate.

Figure 2B:
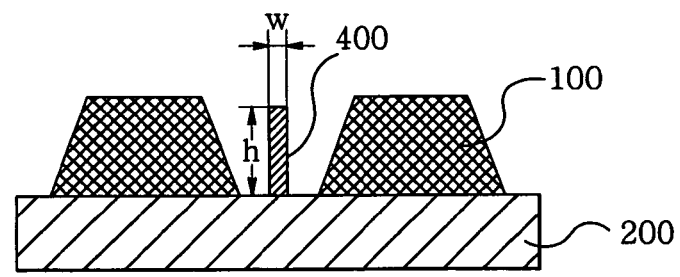

Then, as illustrated in FIG. 2b, an etching film (400) made of a material that can be selectively etched is formed between adjacent light emitting structures (100) spaced apart from each other.

Here, the material that can be selectively etched is preferably photoresist or polyimide.

In addition, it is preferred that the etching film (400) has a width of 5 to 50 □m and a height 5 to 100 □m.

Figure 2C:
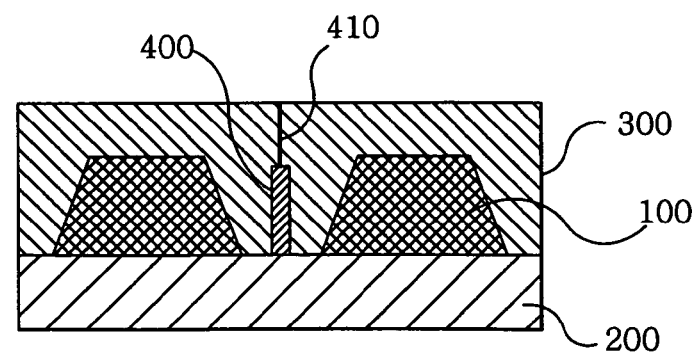

Thereafter, as illustrated in FIG. 2c, a metallic film (300) is formed to wrap or cover the plurality of light emitting structures (100) and the etching film (400).

Here, the metallic film (300) is formed on the heterogeneous substrate (200) while wrapping the plurality of light emitting structures (100) and lateral surfaces and a portion of the top of the etching film (400).

At this time, the metallic film (300) is not formed on a portion of the top of the etching film (400) so that an empty space (410) is formed above the etching film (400). That is, it is preferred that the metallic film (300) be divided by structures respectively, including the light emitting structures (100).

Figure 2D:
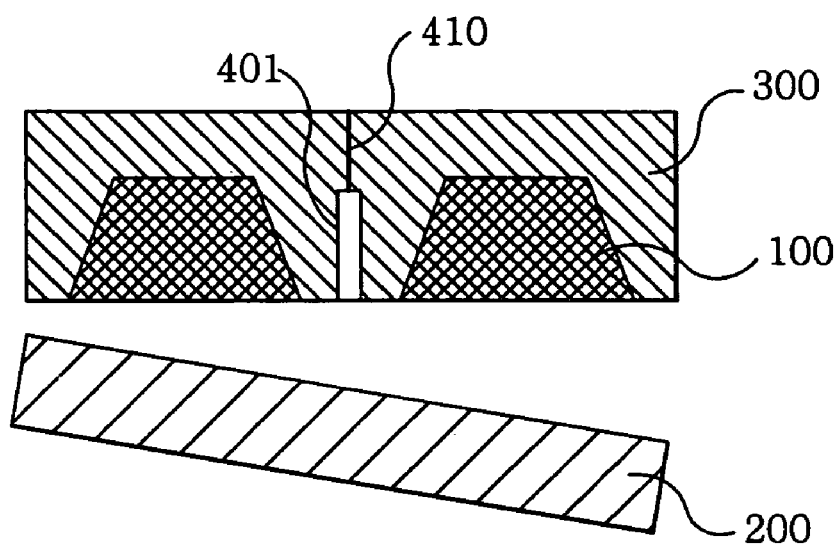

Then, the heterogeneous substrate (200) is separated from the plurality of light emitting structures (100) and the etching film (400) wrapped by the metallic film (300) (FIG. 2d).

Here, the separation of the heterogeneous substrate (200) is preferably made by performing a laser lift off process in which a laser beam is irradiated from below the heterogeneous substrate (200).

Thus, the heterogeneous substrate (200) is separated from the light emitting structures (100), the metallic film (300) and the etching film (400). Thereafter, the etching film (400) is removed.

Here, the etching film (400) is preferably removed by means of etching using an organic solvent such as acetone, or using organic solvent spray.

Then, the removal of the etching film (400) provides an empty space 401 between adjacent light emitting structures (100).

Figure 2E:
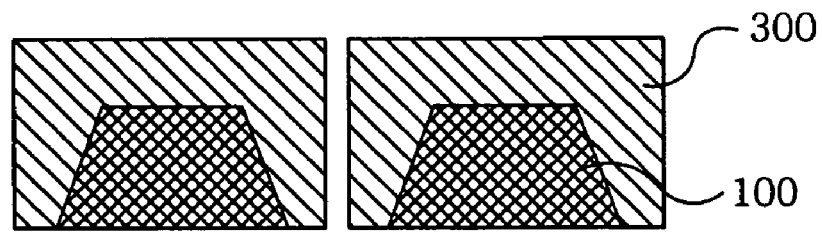

Finally, the plurality of light emitting structures (100) wrapped by the metallic film (300) are individually divided (FIG. 2e).

At this time, in order to release any bonding force that may exist between the plurality of light emitting structures (100), an external force is exerted between the plurality of light emitting structures (100) so that the metallic film can be divided into individual pieces of the metallic film (300) respectively containing the light emitting structures (100).

Here, since the etching film (400) existing between the plurality of light emitting structures (100) is removed to result in the empty space and the metallic film (300) is divided above the etching film (400), the metallic film can be easily divided with only a slight physical force into individual pieces of the metallic films respectively containing the light emitting structures (100).

Preferably, the division is achieved through an expanding and breaking process in which a physical force is applied while expanding the metallic film (300) so that the metallic film can be divided.

Figure 3A:
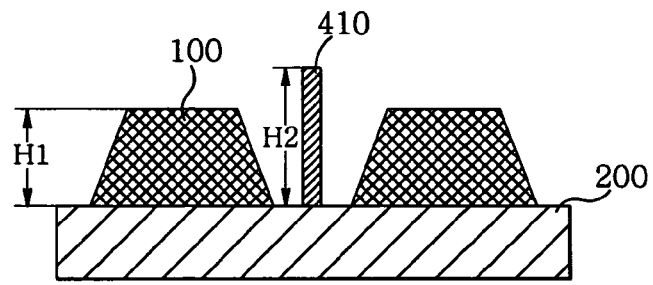
FIGS. 3a to 3d are sectional views illustrating a method for fabricating GaN-based light emitting devices, wherein an etching film is taller than each light emitting structure as compared with the process of FIG. 2b.

Turning now to FIG. 3a, an etching film (410), which has a height H2 taller than that H1 of the light emitting structures (100) and is made of a selectively etchable material, is formed between the plurality of light emitting structures (100) spaced apart from one another.

Figure 3B:
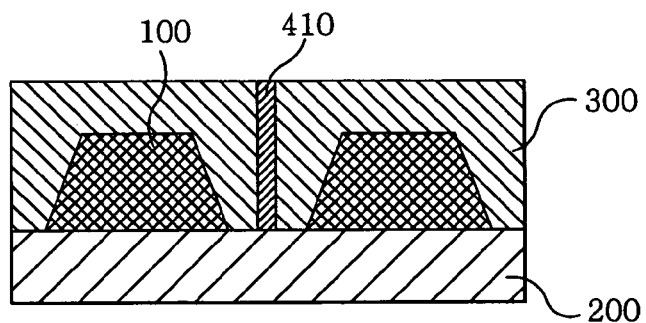
Figure 3C:
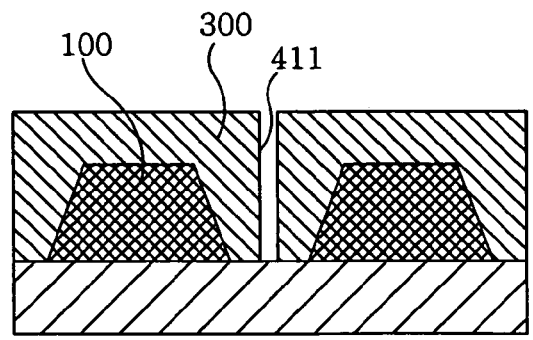

Then, a metallic film (300) is formed to expose the top of the etching film (410) and wrap the plurality of light emitting structures (100) and lateral surfaces of the etching film (410) (FIG. 3b). Thereafter, the etching film (410) is removed (FIG. 3c).

In this process, an empty space (411) is formed between adjacent pieces of the metallic film (300), which wrap the respective light emitting structures (100), by means of the removal of the etching film (410). Thus, the plurality of light emitting structures (100) wrapped by the metallic film (300) are divided to fall within individual regions.

Figure 3D:
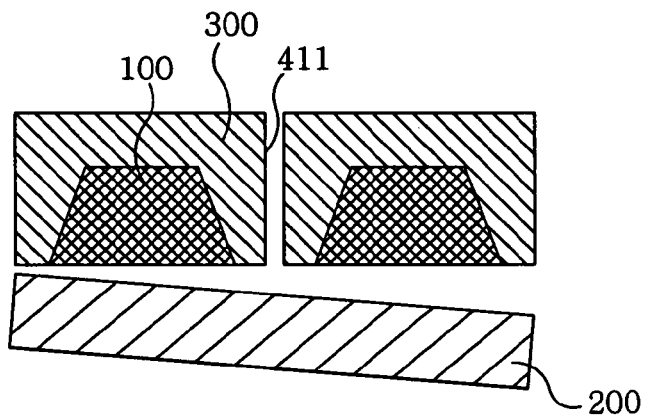

Finally, the heterogeneous substrate (200) is separated from the plurality of light emitting structures (100) wrapped by the metallic film (300) (FIG. 3d).

In the method for fabricating GaN-based light emitting devices through FIGS. 3a to 3d, the devices can be easily divided by removing the etching film (410) to separate the lateral side surfaces of the devices and subsequently removing the substrate to separate the bottom surfaces of the devices.

Figure 4A:
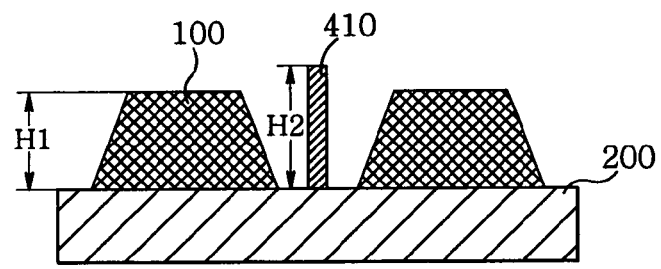
FIGS. 4a to 4e are sectional views illustrating another method for fabricating light emitting devices, wherein an etching film is taller than each light emitting structure as compared with the process of FIG. 2b.

Referring to FIGS. 4a to 4e, an etching film is taller than each light emitting structure as compared with the process of FIG. 2b. An etching film (410), which has a height H2 taller than that H1 of the light emitting structures (100) and is made of a selectively etchable material, is formed between the plurality of light emitting structures (110) spaced apart from one another (FIG. 4a).

Figure 4B:
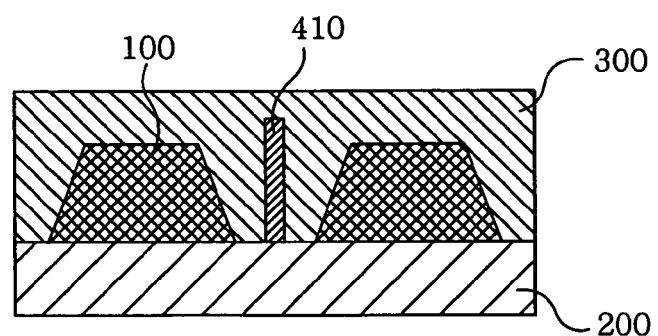

Then, a metallic film (300) is formed to wrap the etching film (410) and the plurality of light emitting structures (100) (FIG. 4b).

Figure 4C:
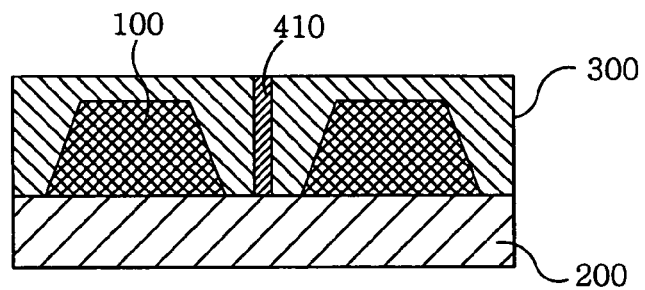
Figure 4D:
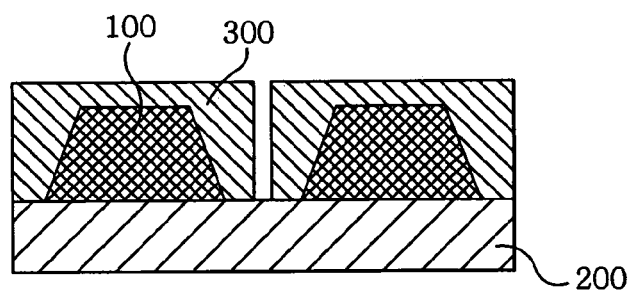

Thereafter, an upper portion of the metallic film (300) is removed to expose the top of the etching film (410) (FIG. 4c). Subsequently, the etching film (410) is removed (FIG. 4d).

Figure 4E:
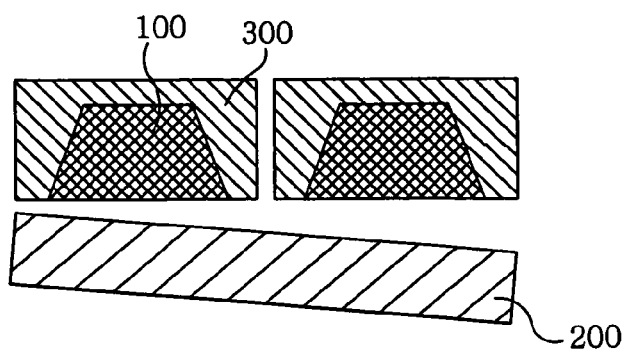

Finally, the heterogeneous substrate (200) is separated from the plurality of light emitting structures (100) wrapped by the metallic film (300) (FIG. 4e).

In the method for fabricating GaN-based light emitting devices through FIGS. 4a to 4e, the devices are divided by forming the metallic film to wrap the top of the etching film, removing the upper portion of the metallic film to expose the top of the etching film, and removing the etching film and the substrate.

Figure 5:
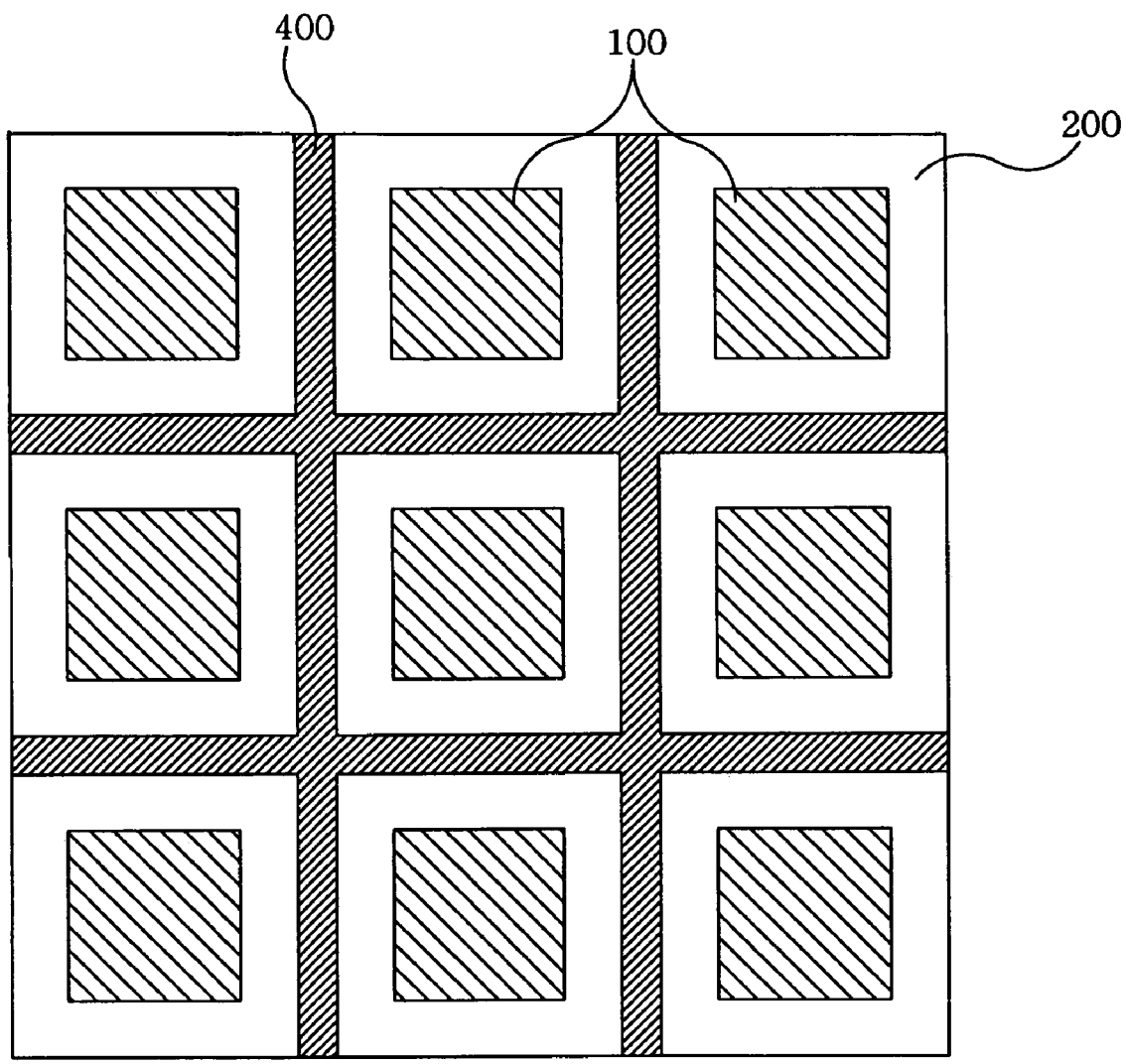
FIG. 5 is a plan view showing an etching film formed between light emitting structures according to the present invention.

FIG. 5 is a plan view showing an etching film formed between light emitting structures according to the present invention. Light emitting structures (100) each structure spaced apart from one another are formed on a heterogeneous substrate (200), and an etching film (400) is formed between the light emitting structures (100).

As illustrated in FIG. 5, the etching film (400) is formed in a grid pattern to separate respective lateral surfaces of the light emitting structures (100).

Turning now to FIGS. 6a to 6e, a plurality of GaN-based light emitting structures (110) are formed on a heterogeneous substrate such that they are spaced apart from one another. An electrode (120) is formed on each of the GaN-based light emitting structures (110). Insulation films (130) are formed respectively to wrap lateral surfaces of the GaN-based light emitting structures (110) and lateral surfaces of the electrodes (120) and to isolate the plurality of GaN-based light emitting structures (110) from one another.

Then, a seed layer (140) is deposited to wrap the top of the electrode (120) and an entire outer surface of the insulation film (130).

Preferably each of the plurality of GaN-based light emitting structures comprise a first semiconductor layer with a first polarity, an active layer, and a second semiconductor layer with a second polarity opposite to the first polarity. If the first polarity is an N-type, the second polarity is a P-type.

In addition, if the uppermost layer is a p-semiconductor layer, the electrode (120) is preferably configured to be in ohmic contact with the p-semiconductor layer.

Furthermore, the insulation film (130) may be formed of a highly reflective film with an insulating property. If such a highly reflective film wraps lateral surfaces of each of the light emitting structures (110), it reflects light emitted through the lateral surfaces of each of the light emitting structures (100), thereby improving light output.

Besides, the seed layer (140) is used to allow a metal to be deposited thereon and is generally formed of a UBM (under bump metallization) layer.

In addition, the heterogeneous substrate (210) is preferably a sapphire (A1203) substrate.

Figure 6A:
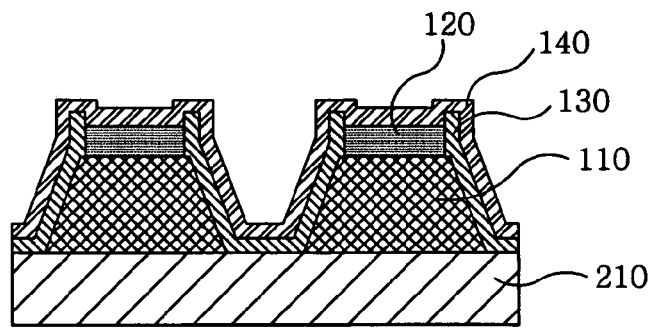
FIGS. 6a to 6e are sectional views illustrating a method for fabricating GaN-based light emitting devices according to a preferred embodiment of the present invention.
Figure 6B:
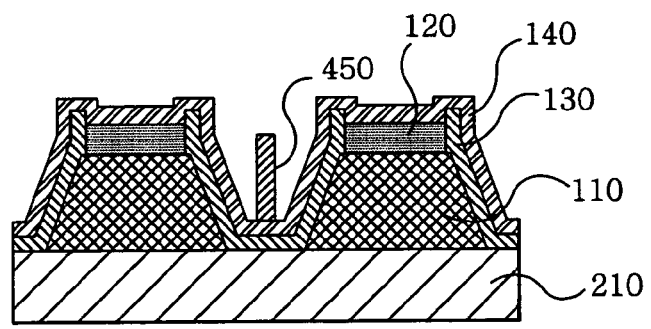

Successively, an etching film (450) is formed of a selectively etchable material on the seed layer (140) between adjacent GaN-based light emitting structures (110) each structure spaced apart from one another (FIG. 6b). Here, the selectively etchable material preferably includes a photoresist or a polyimide.

On the other hand, it is preferred that the etching film (450) have a width of 5 to 50 m and a height of 5 to 100 m.

Figure 6C:
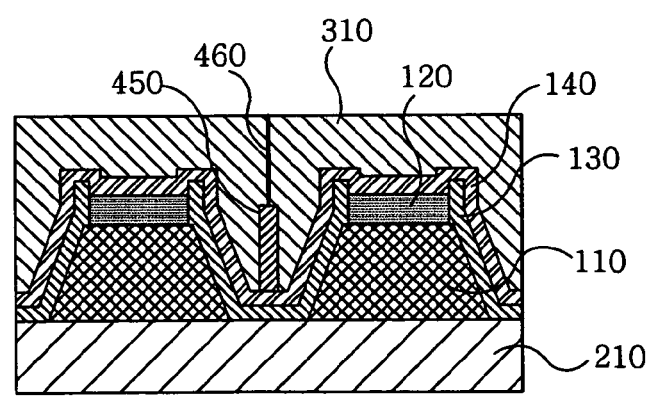

Thereafter, a metallic film (310) is formed to wrap the top of the seed layer (140) and the etching film (450) (FIG. 6c).

At this time, the metallic film (310) is preferably formed through a plating process.

Through the plating process, an incompletely bonded interface area (460) is formed from the top of the etching film (450) to the surface of the metallic film.

Figure 6D:
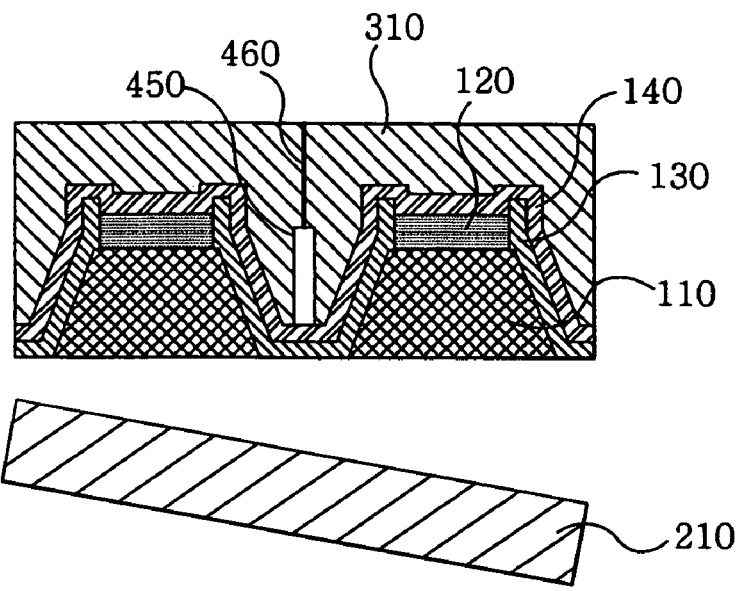

Then, the heterogeneous substrate (210) is separated from the plurality of GaN-based light emitting structures (110) (FIG. 6d).

Here, the separation of the heterogeneous substrate is preferably performed using a laser lift off process in which laser beam is irradiated from below the heterogeneous substrate. Thereafter, the etching film (450) is removed.

Here, the etching film (450) is removed by means of etching with an organic solvent such as acetone, or by using organic solvent spray.

Then, the removal of the etching film (450) provides an empty space (451) formed between adjacent GaN-based light emitting structures (100).

Figure 6E:
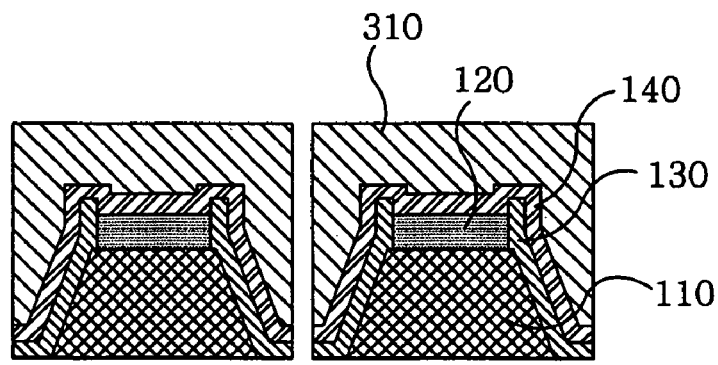

Finally, the plurality of GaN-based light emitting structures (100) wrapped by the metallic film (310) are divided individually (FIG. 6e).

Since the etching film (450) existing between the plurality of light emitting structures (100) is removed to result in the empty space and the metallic film (310) is divided above the etching film (450), the metallic film (130) and the seed layer (140) can be easily broken and divided with only a slight physical force into individual pieces of the metallic films (310) respectively containing the light emitting structures (100).

Here, the dividing process of FIG. 6e is performed using an expanding and breaking process.

At this time, the thicknesses of the insulation film (130) and the seed layer (140), which are disposed under the etching layer (450), are small enough to be easily broken and thus do not disturb the division of the devices.

Figure 8:
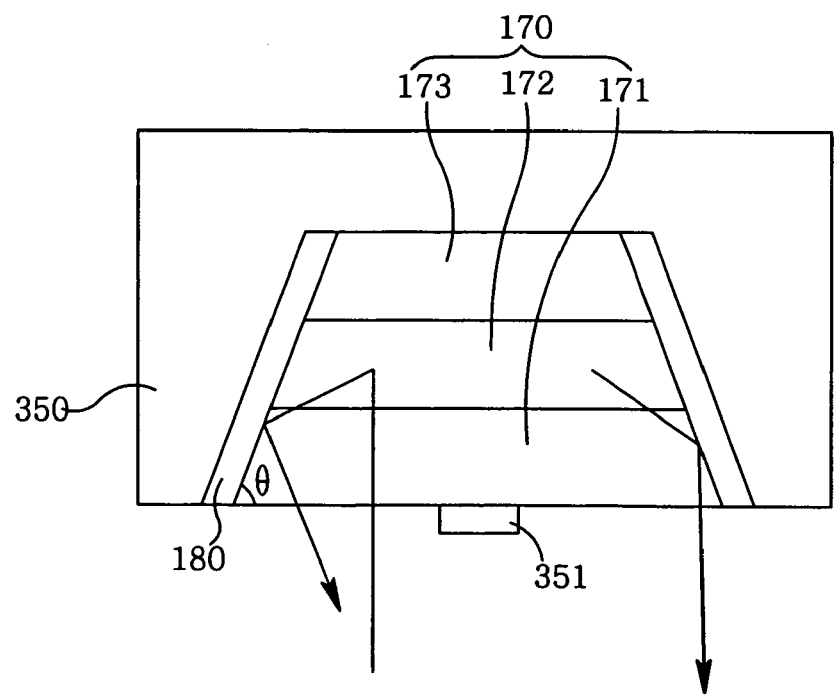
FIG. 8 is a sectional view of a light emitting device according to the present invention.

FIG. 8 is a sectional view of a light emitting device according to the present invention. The light emitting device comprises a light emitting structure (170) having slant lateral side surfaces, and including a first semiconductor layer (171) with a first polarity, an active layer (172) and a second semiconductor layer (173) with a second polarity, which are stacked sequentially; a highly reflective film (180) with an insulating property formed on lateral side surfaces of the light emitting structure (170); a first electrode (350) wrapping and the second semiconductor layer (173) with a second polarity; and a second electrode (351) formed below the first semiconductor layer (171) with a first polarity.

Here, since each lateral surface of the light emitting structure (170) is inclined at a certain angle, light emitted from the active layer (172) is reflected on the highly reflective film (180) and passes through the first semiconductor layer (171) with the first polarity, resulting in an increased amount of light to be emitted downwardly of the light emitting structure (170).

Figure 9:
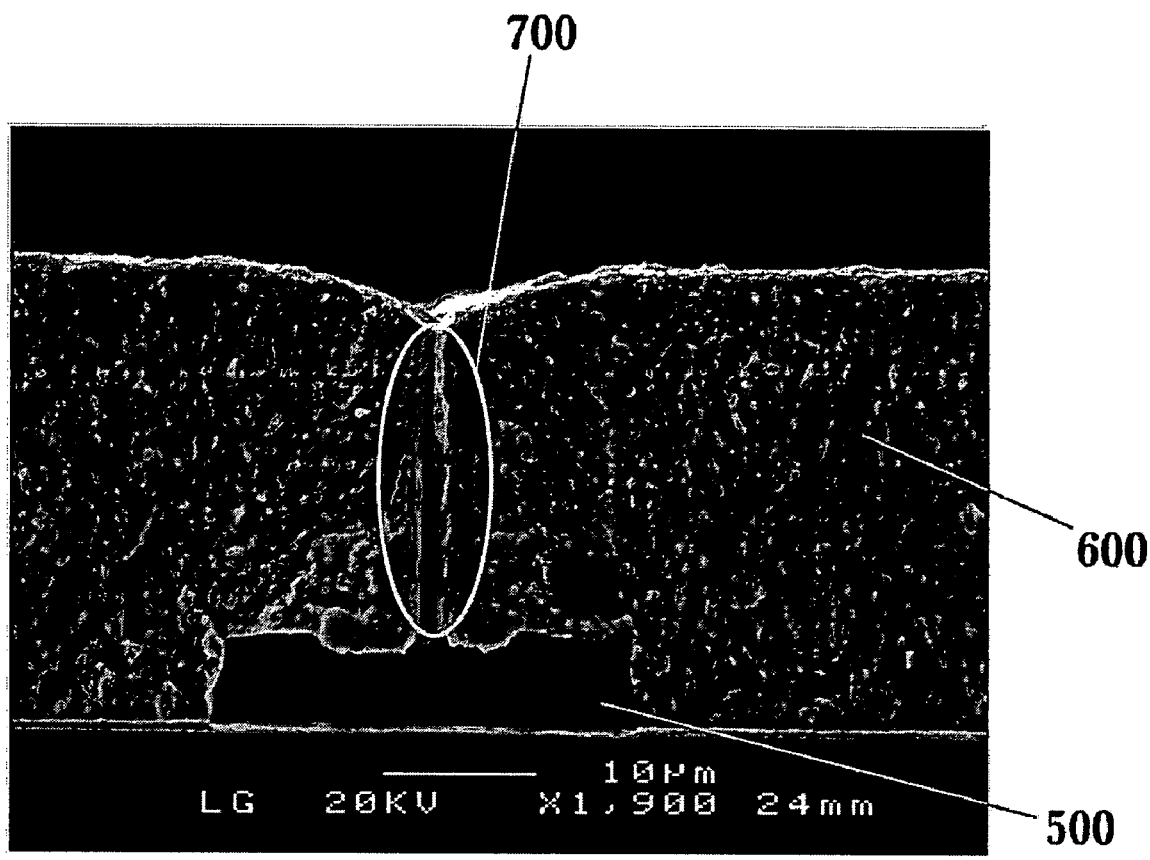
FIG. 9 is a photograph showing an incompletely bonded interface area where a copper film is formed on the etching film in accordance with the present invention.

FIG. 9 is an electron microscopic photograph showing a case where an etching film (500) is formed of photoresist between spaced-apart GaN-based light emitting structures, and a metallic film (600) made of copper is then plated thereon.

As can be seen from the photograph, an incompletely bonded interface area (510) is formed from the top of the etching film (500) to the surface of the metallic film (600).

Figure 10:
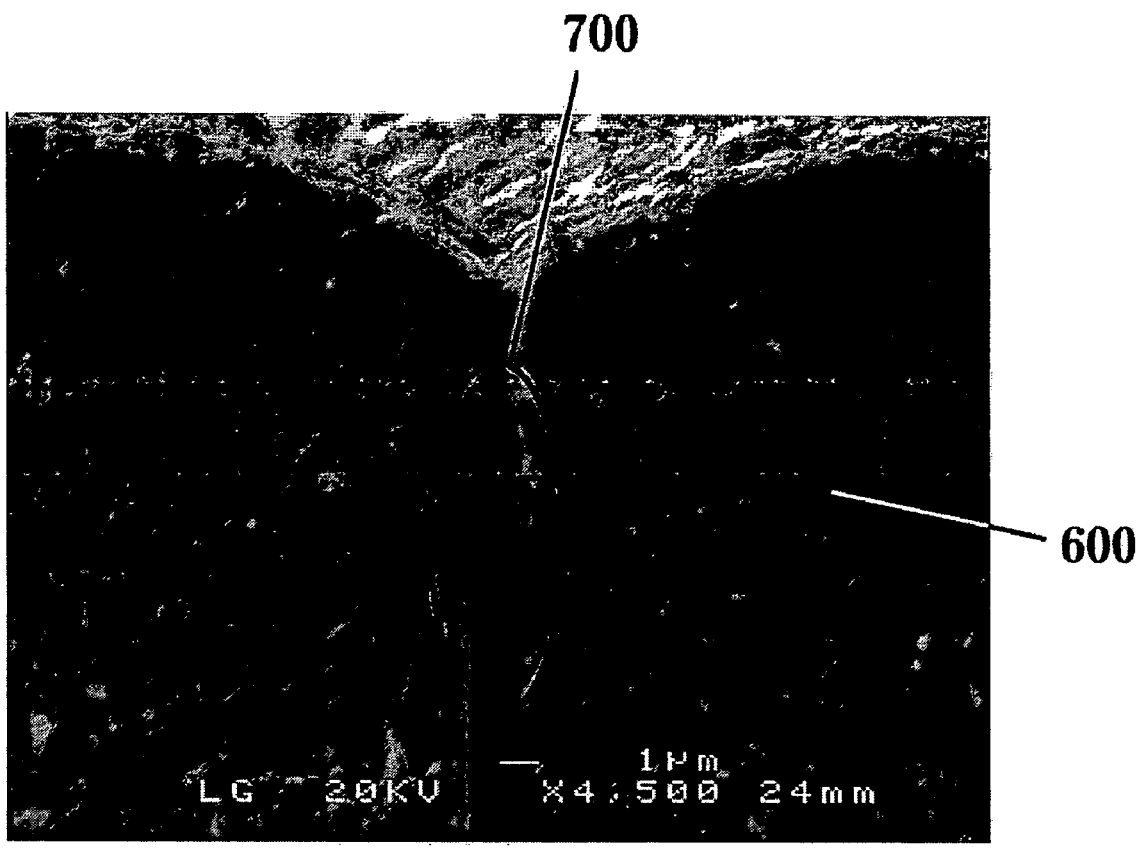
FIG. 10 is an enlarged photograph showing the interface area of FIG. 9.

FIG. 10 is an enlarged photograph of the interface area (510) of FIG. 9.

As described above, according to the present invention, there is an advantage in that an etching film is removed to separate respective lateral surfaces of light emitting structures from one another, and a substrate is removed to separate lower portions of the devices from each other, thereby further facilitating division of the devices.

Further, according to the present invention, there are advantages in that the devices are divided without carrying out a scribing process so that the occurrence of defects such as cracking or bending can be reduced, and spacing between the devices for the scribing process need not be maintained, thereby increasing the degree of integration of devices.

Although the present invention has been described in detail in connection with the preferred embodiments, it is not limited thereto. It will be readily understood by those skilled in the art that various modifications and changes can be made thereto without departing from the spirit and scope of the present invention, and such modifications and changes fall within the scope of the invention defined by the appended claims.

What is claimed is:

1. A method for fabricating light emitting devices, comprising:
    forming a plurality of light emitting structures on a substrate such that the structures are spaced apart from one another;
    forming an etching film made of a selectively etchable material between adjacent light emitting structures;
    forming a metallic film covering the plurality of light emitting structures and the etching film;
    separating the substrate from the plurality light emitting structures and the etching film covered by the metallic film;
    removing the etching film; and
    individually dividing the plurality of light emitting structures covered by the metallic film.

2. The method as claimed in claim 1, wherein the metallic film is at most partially formed on a top of the etching film, thereby forming an empty space on the top of the etching film so that the metallic film is divided into pieces, each piece containing at least one light emitting structure.

3. A method for fabricating light emitting devices, comprising:
    forming a plurality of light emitting structures on a substrate such that the structures are spaced apart from one another;
    forming an etching film between adjacent light emitting structures, the etching film having a height larger than that of the plurality of light emitting structures and made of a selectively etchable material;
    forming a metallic film covering the plurality of light emitting structures and lateral surfaces of the etching film while exposing a top of the etching film;
    removing the etching film; and
    separating the substrate from the plurality light emitting structures covered by the metallic film.

4. A method for fabricating light emitting devices, comprising:
    forming a plurality of light emitting structures on a substrate such that the structures are spaced apart from one another;
    forming an etching film between adjacent light emitting structures, the etching film having a height larger than that of the plurality of light emitting structures and made of a selectively etchable material;
    forming a metallic film covering the etching film and the plurality of light emitting structures;
    removing an upper portion of the metallic film to expose a top of the etching film;
    removing the etching film; and
    separating the substrate from the plurality light emitting structures covered by the metallic film.

5. The method as claimed in claim 1, wherein each of the plurality of light emitting structures comprises an n-semiconductor layer, an active layer and a p-semiconductor layer, which are sequentially stacked, and an insulation film is formed on lateral surfaces of the n-semiconductor layer, the active layer and the p-semiconductor layer.

6. The method as claimed in claim 1, wherein the substrate comprises a sapphire substrate.

7. The method as claimed in claim 1, wherein the step of separating the substrate is performed using a laser lift off process.

8. The method as claimed in claim 1, wherein the selectively etchable material comprises a photoresist or a polyimide.

9. The method as claimed in claim 1, wherein the etching film has a width of about 5 to 50 □m and a height of about 5 to 100 □m.

10. The method as claimed in claim 1, wherein the step of removing the etching film comprising removing the etching film by means of etching using an organic solvent.

11. A method for fabricating light emitting devices, comprising the steps of:
    forming a plurality of GaN-based light emitting structures on a substrate such that the structures are spaced apart from one another;
    forming an electrode on each of the plurality of GaN-based light emitting structures;
    forming an insulation film covering lateral side surfaces of the plurality of GaN-based light emitting structures and lateral surfaces of the electrodes while isolating the plurality of GaN-based light emitting structures from one another;
    forming a seed layer covering a top of the electrode and a surface of the insulation film;
    forming an etching film made of a selectively etchable material on the seed layer between the spaced-apart GaN-based light emitting structures;
    forming a metallic film covering a top of the seed layer and the etching film;
    separating the substrate from the plurality of GaN-based light emitting structures;
    removing the etching film; and
    individually dividing the plurality of GaN-based light emitting structures covered by the metallic film.

12. The method as claimed in claim 11, wherein each of the plurality of GaN-based light emitting structures comprises a first semiconductor layer with a first polarity, an active layer, and a second semiconductor layer with a second polarity opposite to the first polarity.

13. The method as claimed in claim 11, wherein the insulation film comprises a highly reflective film with an insulating property.

14. The method as claimed in claim 11, wherein the seed layer comprises an under bump metallization (UBM) layer.

15. The method as claimed in claim 11, wherein the metallic film is formed through a plating process.

16. The method as claimed in claim 15, wherein an unbonded interface area is formed from a top of the etching film to a surface of the metallic film by means of the plating process.

17. The method as claimed in claim 11, wherein the selectively etchable material comprises photoresist or polyimide.

18. The method as claimed in claim 17, wherein the step of removing the etching film comprises removing the etching film by means of etching using an organic solvent.

* * * * *